United States Patent
Sturgeon et al.

(10) Patent No.: US 11,436,385 B2
(45) Date of Patent: Sep. 6, 2022

(54) OVERARCHING RELATIONSHIP MANAGER AND EDITOR FOR SCALING COMPLEX ARCHITECTURE REPRESENTATIONS

(71) Applicant: The Boeing Company, Chicago, IL (US)

(72) Inventors: Annelisa M. Sturgeon, Seattle, WA (US); Charles Mark Williams, Seattle, WA (US); Aleksander Przybylo, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 464 days.

(21) Appl. No.: 16/689,547

(22) Filed: Nov. 20, 2019

(65) Prior Publication Data
US 2021/0149998 A1 May 20, 2021

(51) Int. Cl.
| | | |
|---|---|---|
| G06F 9/44 | (2018.01) | |
| G06F 9/455 | (2018.01) | |
| G06F 9/445 | (2018.01) | |
| G06F 30/00 | (2020.01) | |
| G06F 9/38 | (2018.01) | |
| G06F 8/71 | (2018.01) | |
| G06F 8/20 | (2018.01) | |
| G06F 16/901 | (2019.01) | |

(52) U.S. Cl.
CPC .............. *G06F 30/00* (2020.01); *G06F 8/24* (2013.01); *G06F 8/71* (2013.01); *G06F 9/3838* (2013.01); *G06F 16/9027* (2019.01)

(58) Field of Classification Search
CPC ........ G06F 30/00; G06F 16/9027; G06F 8/24; G06F 8/71; G06F 8/20; G06F 8/36; G06F 9/3838; G06Q 10/06; G06Q 10/10
See application file for complete search history.

(56) References Cited

U.S. PATENT DOCUMENTS 9,411,557 B1 * 8/2016 Cartey ...................... G06F 8/74

OTHER PUBLICATIONS

Arora et al., Using dependency graphs to support collaboration over GitHub: The Neo4j graph database approach, 7 pages (Year: 2016).*
"Architecture description language", Wikipedia, https://en.wikipedia.org/wiki/Architecture_description_language, last edited Jul. 13, 2019, pp. 1-4.
"Systems Modeling Language", Wikipedia, https://en.wikipedia.org/wiki/Systems_Modeling_Language, last edited Apr. 11, 2019, pp. 1-5.

* cited by examiner

*Primary Examiner* — Thuy Dao
(74) *Attorney, Agent, or Firm* — Gates & Cooper LLP

(57) ABSTRACT

A method and system provide the ability to manage objects across multiple independent projects. A graphically descriptive design representation of a master project for an engineering system architecture model is generated and displayed. The model consists of the multiple independent projects with each project owning a set of data that is arranged as a hierarchy of nodes that each represents an object of the set of data. Links between nodes define a dependency relationship between the objects represented. A request to reference data is received. A determination is made regarding whether the request is consistent with the master project representation. The request is allowed or rejected depending on the determination.

24 Claims, 6 Drawing Sheets

OVERARCHING RELATIONSHIP MANAGER AND EDITOR FOR SCALING COMPLEX ARCHITECTURE REPRESENTATIONS

BACKGROUND OF THE INVENTION

1. Field of the Invention

The present invention relates generally to project designs, and in particular, to a method, apparatus, system, and article of manufacture for managing software objects of/in a project design.

2. Description of the Related Art

In systems engineering, software engineering, and enterprise modelling and engineering, system architectures are often designed using architecture description languages (ADLs) (e.g., as a computer language to create a description of the software architecture). For example, the systems modeling language (SysML) is a general purpose modeling/ADL language used to support the specification, analysis, design, verification, and validation of systems and systems-of-systems in systems engineering applications. However, there are limitations with existing ADLs/SysMLs with respect to designing and utilizing (e.g., amongst multiple collaborating users) architecture description models. In this regard, architecture description models may be large and complex. The ADL/SysML specification and associated applications do not scale to a required/desired level of complexity. In addition, models are loaded into local machine memory (RAM—random access memory) and can exceed the scale of the standard computing hardware (the use of standard computing hardware is often the most practical based on the number of users and designers that contribute to the product design). A more detailed description of the problems of the prior art may be useful to better understand the invention.

As described above, the ADL/SysML is used to create/define models and the relationships between objects of the model. Some prior art solutions segregate models that "use" other models (but require connections/relationships between them) into branch projects. Such solutions work until a user expands the used models and subsequently loads all the segregated models into one session, causing the application to crash or significantly degrade performance. Project relationships may be controlled by a SysML specification, and the implementing applications load all of the branch projects into local memory.

Other prior art solutions integrate models within a separate model that "uses" two segregated independent models, creates the relationships between them, and stores those relationships. However, in such solutions the "used" models will eventually create a circle or model usage. The application and SysML specification and application cannot handle this type of integration.

Additional prior art solutions may segregate models that do not interact and constrain models to a scalable level of complexity. However, in such solutions, the major advantages of switching to a model based design process (from historical documentation) will be negated because systems will be limited to their respective simple models.

In further prior art solutions, instead of creating branches within a project, OSLC (open services for lifecycle collaboration) links are created between elements in separate SysML models. OSLC links can be managed in a separate database. However, in such solutions, there is no master view or control of the overall set of data relationships between projects. Instead, each link will have to be explored to understand its intent or content. Thus, the ability to query all of the models within an implied hierarchy is lost.

In view of the above, problems of the prior art include that of designing and analyzing a part from the preliminary to the detailed design in an efficient manner while seamlessly integrating requirements of such parts.

SUMMARY OF THE INVENTION

A computer-implemented method and system manages objects across multiple independent projects. A graphically descriptive design representation of a master project for an engineering system architecture model is generated and displayed. The engineering system architecture model consists of the multiple independent projects. Each of the multiple independent projects consists of and owns a set of data. The set of data is represented by the graphically descriptive design representation and provides a hierarchy of two or more nodes arranged hierarchically. Each of the two or more nodes represents an object of the set of data, and links between the two or more nodes define a dependency relationship between the objects represented by the linked nodes.

A request to reference data in the set of data in a second project of the multiple independent projects is received from a first designer of a first project of the multiple independent projects. A determination is made regarding whether the request to reference data is consistent with the graphically descriptive design representation of the master project. The request to reference data is allowed if a dependency relationship exists between the first project and the second project in the master project. The request is rejected if the dependency relationship does not exist between the first project and the second project.

The generating and displaying may include generating a root node of the two or more nodes that represents an overall system for the engineering system architecture model. The engineering system architecture model may be decomposed into multiple subcomponents, wherein each remaining node of two or more nodes (102) represents one of the multiple subcomponents.

In one or more embodiments, the request to reference data may be a request to mount a software project. In such embodiments, the determining, the allowing, and the rejecting control the mounting.

The object of the set of data may be a business object, and the dependency relationship may be a business or logical dependency, composition, or provenance that ties two business objects together.

The determining if the request to reference data is consistent with the graphically descriptive design representation of the master project may include analyzing, in the master project, the graphically descriptive design representation including the dependency relationship between the objects represented by the nodes.

A change may be made to the graphically descriptive design representation in the form of the creation of a new dependency relationship. Thereafter, a new version of the graphically descriptive design representation may be iterated, and the new version may be recorded based on the new dependency relationship. Subsequent versions of the graphically descriptive design representation may be further iterated. In addition, subsequent to the recording, the new version may be accessed to determine what the graphically descriptive design representation looked like at a time the new dependency relationship was created.

Embodiments may include utilizing dependency inheritance. Such utilization may include determining that the graphically descriptive design representation includes redundancy, and redrawing the graphically descriptive design representation by chaining the dependency relationships to remove the redundancy.

Control of the graphically descriptive design representation may be limited to an author of the graphically descriptive design representation.

The graphically descriptive design representation may be managed and such management may be conducted outside of the multiple independent projects that own the two or more nodes.

An additional independent project may be added to the graphically descriptive design representation. Based on the graphically descriptive design representation, an impact analysis of the adding may be conducted, and the impact analysis analyzes an impact (of the addition) on the multiple independent projects.

In one or more exemplary embodiments, a first user may have access permissions to the first project and the second project, a second user may have access permissions to the first project and does not have access permissions to the second project, and the request to reference data may include a chaining request from the first user to chain a project mount from the first project to the second project. In such exemplary embodiments, the method and system may determine that the chaining request would expose the second project to the second user via the chain, and as a result, reject the request to reference data (based on the determining).

Further to the above, a request may be received to add a new dependency relationship to the graphically descriptive design representation. Upon determining that the new dependency relationship would create a dependency loop, the method and system may prevent the addition.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
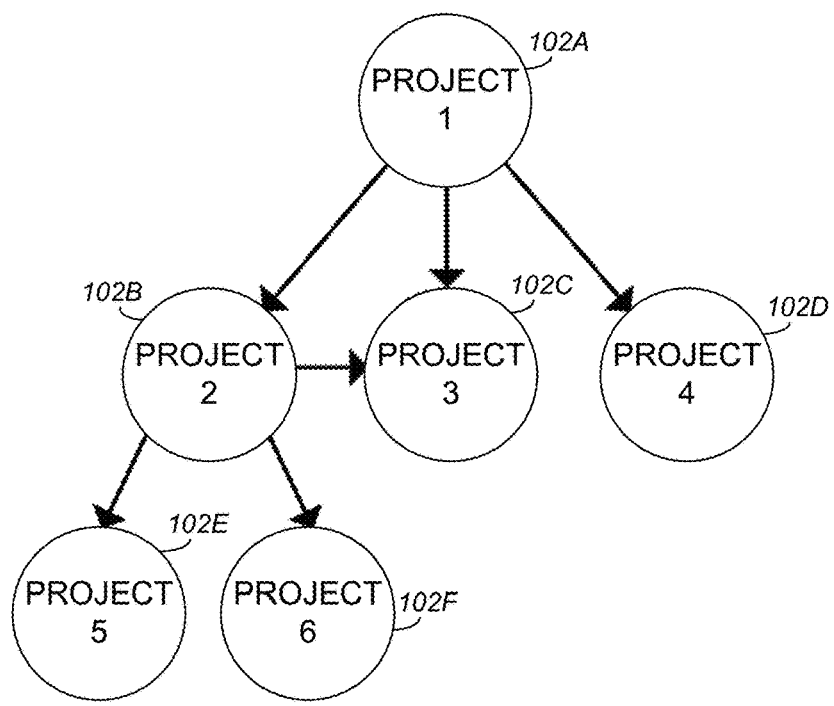
FIG. 1 illustrates a master project containing project reference nodes in accordance with one or more embodiments of the invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.
Problems and Overview Embodiments of the invention describe a method of managing links between objects in disjoint projects. While the examples described herein focus on project data consisting of hierarchical structures, embodiments may be adapted for and used in software packages, databases or any other use case requiring robust dependency management.

As used herein, the term project describes a set of data consisting of a hierarchy of nodes where each node represents some physical or abstract concept such as a system function, a hardware part, a mechanic on the shop floor, a key performance indicator or any other business object. The relationships between the nodes identify business or logical dependencies, compositions, provenance or any other important piece of information that ties two business objects together.

In practice, it is desirable to split project data into small manageable partitions so that different users (henceforth referred to as modelers) can work on their portion independently and on a size of data that they can easily comprehend. Many software tools, depending on their architecture, are also limited by the amount of information that can be loaded into memory. The problem then arises of how to effectively manage the overall collection of data and maintain consistency between objects spread across multiple independent projects.

Embodiments of the invention may be built for system engineering models using SysML as the underlying project data. While most Customer-Off-The Shelf (COTS) software solutions have some cross-project linking capability, they lack a robust method of managing those links interactively during the design process without post processing. COTS software solutions leave the task of defining the dependency graph between the projects to individual project modelers and provide no systematic control over the dependencies. COTS software solutions also often force the ownership of the relationship into the "using/impacted" project (as opposed to the "used/impacting" project).

In view of the above, embodiments of the invention provide a solution to various problems:

One problem is that of the need to split large projects into multiple smaller projects. Such a requirement/necessity may be due to memory limitations on client machines running the model authoring software, the need for segregating the data based on access policies, the need to enable modelers to work on projects of a size that they can easily grasp, and/or the need to enable modelers to temporarily isolate themselves from the churn of change in other areas.

Another problem is that user created project dependencies may become very hard to untangle as the project count increases. Further, the overall (cross-project) impact analysis may be very hard/difficult to conduct without clearly defined dependencies between projects. In addition, modelers may inadvertently expose protected information by chaining project mounts. Also, modelers may inadvertently create dependency loops.

Embodiments of the invention overcome such problems.
Managing Objects Across Multiple Independent Projects A key component of the linking method of embodiments of the invention is the master project. The master project is a structure that defines the dependencies between the projects. The master project is created by a master project architect having authority over the overarching program.

FIG. 1 illustrates a master project containing project reference nodes 102A-102F (collectively referred to as project reference nodes 102) in accordance with one or more embodiments of the invention. A primary purpose of the master project is to provide visibility of the overall project architecture. A designer within one of the partition projects would be able to see the projects to which he/she is allowed to create relationships. By stating that Project 1 102A depends on Project 2 102B (represented by an arrow from 102A to 102B), data is allowed from Project 2 102B to be referenced in Project 1 102A. That also means that, from now on, changes in Project 2 102B will have potential impacts on data in Project 1 102A. If there is no dependency defined from Project 1 102A to Project 2 102B, it means that the designer within Project 1 102A will not be allowed to reference any data in Project 2 102B. In order to accomplish that, the designer would have to submit a request to create that dependency, which would then be reviewed by the master project owner.

Figure 2:
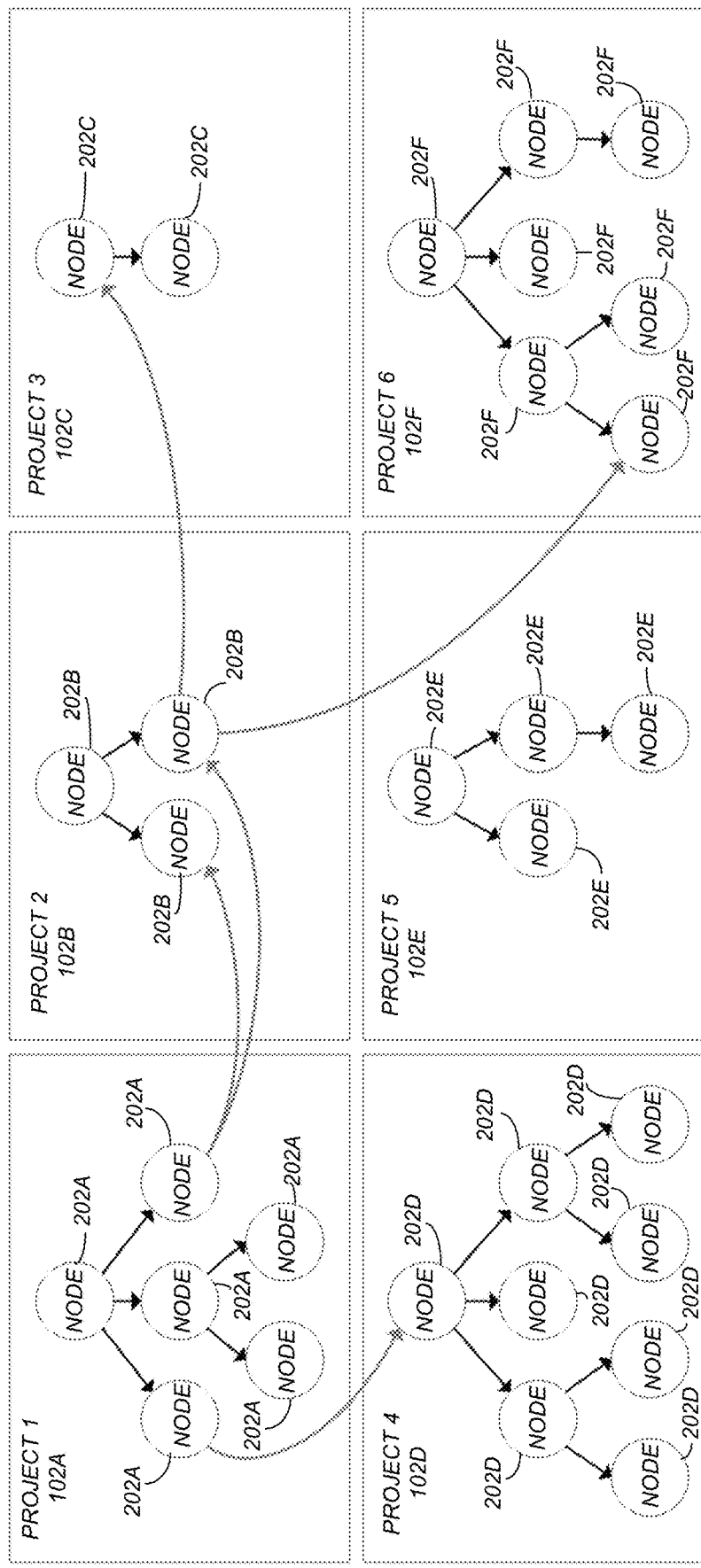
FIG. 2 illustrates an example of project data that fully conforms to the project dependency graph of FIG. 1.

FIG. 2 illustrates an example of project data that fully conforms to the project dependency graph of FIG. 1 (i.e., the project data includes valid relationships between projects). As illustrated, each project 102 (e.g. project 1=102A, project 2=102*b*, etc.) owns a set of data represented by nodes 202A-202F. In FIG. 2, a relationship exists from node 202A (within Project 1 102A) to node 202D (within Project 4 102D). As the master project in FIG. 1 includes a relation from Project 1 102A to Project 4 102D, the relationship between node 202A and node 202D is a valid relationship. Similarly, valid relationships are defined in the master project of FIG. 1 from Project 1 102A to Project 2 102B, from Project 2 102B to Project 3 102C, and from Project 2 102B to Project 6 102F. Based on such valid relationships in the master project of FIG. 1, similar relationships may be mapped from node 202A to node 202B, node 202B to node 202C, and node 202B to node 202F. In addition, project dependencies might exist even if there are no references between objects for those projects (e.g., from Project 1 102A to Project 3 102C).

Figure 3:
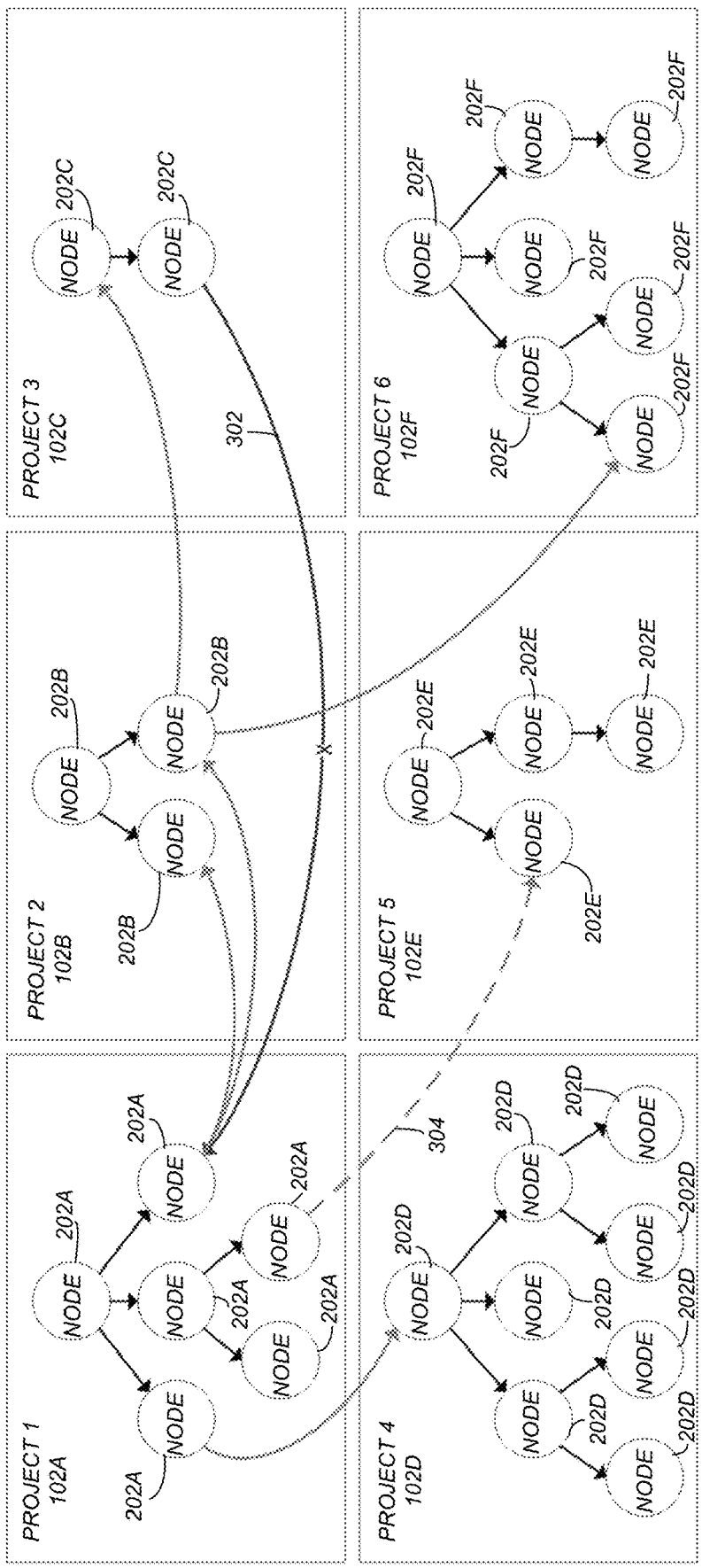
FIG. 3 illustrates an invalid relationship (that violates the dependency graph of FIG. 1) and a conditionally allowed relationship between projects in accordance with one or more embodiments of the invention.

FIG. 3 illustrates an invalid relationship (that violates the dependency graph of FIG. 1) and a conditionally allowed relationship between projects in accordance with one or more embodiments of the invention. Specifically, the invalid relationship 302 from Project 3 102C to Project 1 102A (solid line with x in the middle form node 202C to node 202A) actually links objects between two projects (i.e., Project 3 102C and project 1 102A) that are linked in the master project but the relationship 302 goes in the wrong direction. The relationship 302 creates a loop Project 102A-Project 2 102B-Project 3 102C-Project 1 102A. Such a loop can be avoided in accordance with one or more embodiments of the invention. The designer in Project 3 102C wouldn't know that Project 1 102A depends on Project 2 102B which in turns depends on Project 3 102C. This is something that would only be detected by running a cross-project dependency analysis (notice that this is a toy scenario and in practice there can be thousands of those projects containing millions of nodes each, causing such analysis to be very resource intensive), but in this case is easily detected by analyzing the dependency graph in the master project FIG. 1.

Figure 4:
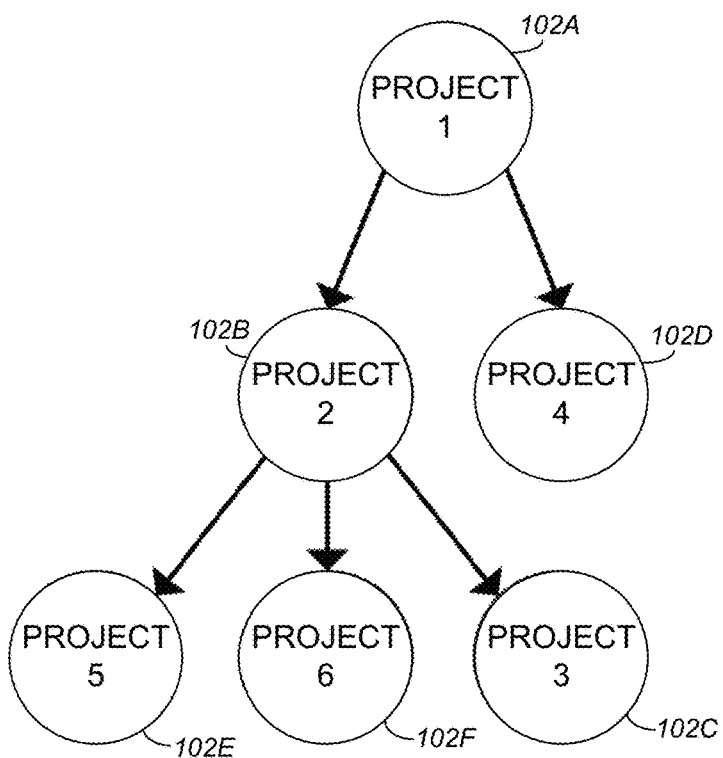
FIG. 4 illustrates a revised dependency graph of FIG. 1 in which redundancy has been eliminated in accordance with one or more embodiments of the invention.

The conditionally allowed relationship 304 from Project 5 102E to Project 1 102A (dashed line) is allowed if one considers dependency inheritance. In order to simplify the graph of FIG. 1, embodiments of the invention may allow relationships to projects 102 to which a dependency may be obtained by chaining other dependencies. In this case the graph in FIG. 1 may be redrawn to eliminate a redundancy. FIG. 4 illustrates a revised dependency graph of FIG. 1 in which redundancy has been eliminated (i.e., dependency graph equivalency through dependency inheritance) in accordance with one or more embodiments of the invention. As illustrated, the dependencies from Project 1 102A to Project 3 102C, and from Project 2 102B to Project 3 102C is redundant. To eliminate the redundancy, FIG. 1 is simply redrawn (as illustrated in FIG. 4) to only reflect the dependency from Project 2 102B to Project 3 102C, and by inheritance, one may determine that Project 3 102C is also dependent on Project 1 102A.

One aspect of embodiments of the invention is the fact that the dependency graph in the master project is configuration controlled. As used herein, the term configuration controlled means that each time a change is made to the graph, the version of the graph iterates and whenever a new relationship is created between two projects 102, the version of the dependency graph is recorded on the relationship. This allows one to understand (in the future) what the dependency graph looked like at the time the relationship was created (e.g., in case an issue is discovered). Such a capability also serves as a method for publishing a released resource that everyone can reference and trust.

While other dependency management methods typically leave each project 102 in control of its own dependencies, embodiments of the invention instills more rigor and oversight into the process and delegates those tasks to a higher level entity. Over time, as the number of projects 102 and individual project complexity grows, this approach provides a robust methodology for easily and efficiently performing impact analysis as well as preventing the relationships from forming a "spaghetti" of tangled data that becomes unmanageable.

General Process Flow

Figure 5:
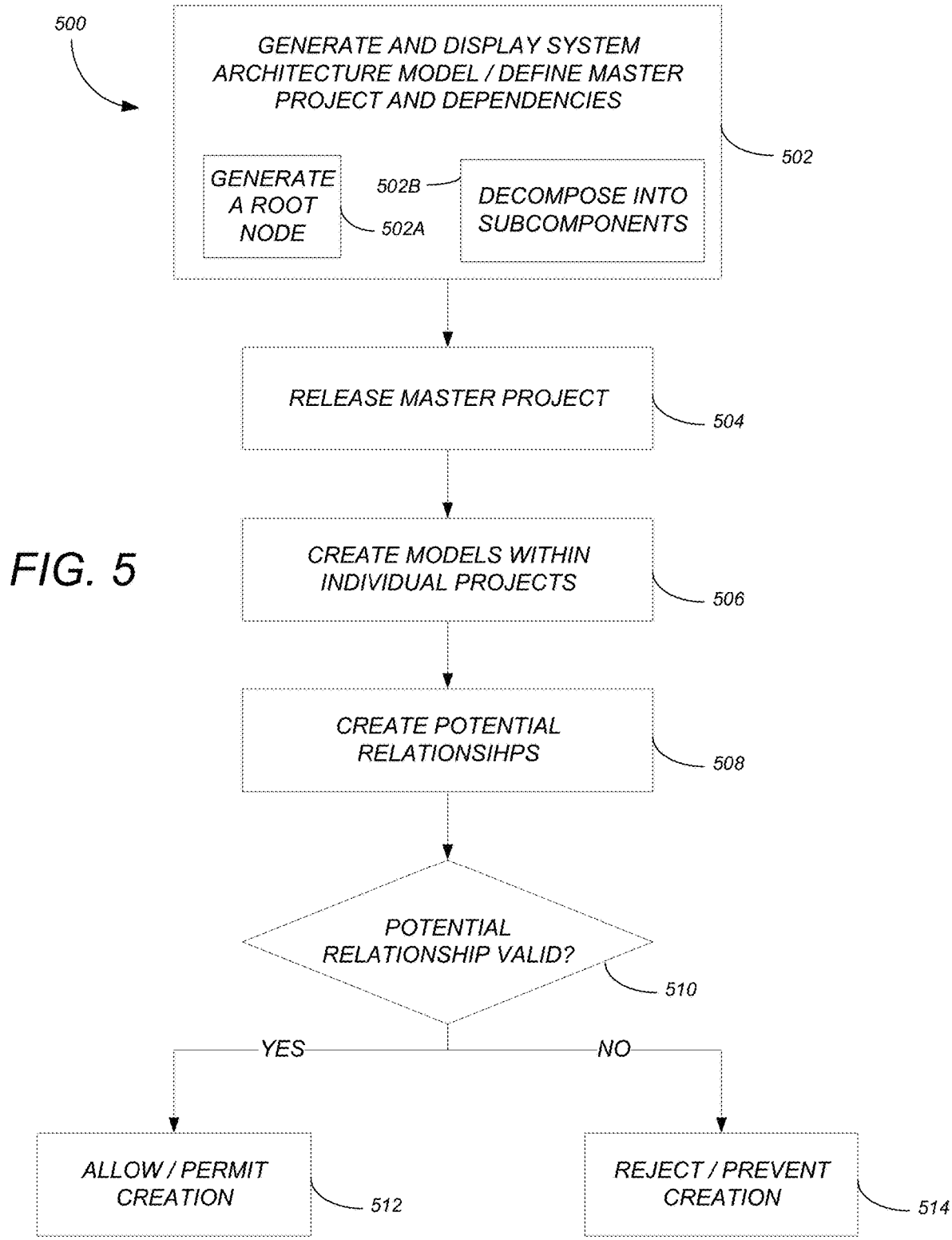
FIG. 5 illustrates the general typical process flow for managing objects across multiple independent projects in accordance with one or more embodiments of the invention.

FIG. 5 illustrates the general typical process flow for managing objects across multiple independent projects in accordance with one or more embodiments of the invention.

At step 502, a master project architect defines the project breakdown and the dependencies between individual projects in the master project. In this regard, a graphically descriptive design representation of a master project for an engineering system architecture model is generated (e.g., by a master project architect/author). The engineering system architecture model includes the multiple independent projects that each include and own a set of data. The set of data is represented by the graphically descriptive design representation and provides a hierarchy of two or more nodes arranged hierarchically. Each of the nodes in the hierarchy represents an object of the set of data, and links between nodes define a dependency relationship (between the objects represented by the linked nodes). Further, the defining (i.e., the generating) at step 502 may include generating 502A a root node (of the two or more nodes) that represents an overall system for the engineering system architecture model. In addition, the defining/generating in step 502 may also include decomposing 502B the engineering system architecture model into multiple subcomponents, where each node represents one of the multiple subcomponents.

Further to the above, the graphically descriptive design representation may be managed (i.e., within step 502) where the managing is conducted outside of the projects that own the nodes in the representation.

At step 504, the master project architect/author releases the master project. During this step, the graphically descriptive design representation is displayed.

At step 506, modelers create models within individual projects.

At step 508, modelers create potential relationships between projects. In other words, at step 508, a first designer of a first project (of the multiple independent projects) provides a request to reference data in the set of data in a second project (of the multiple independent projects) (e.g., the potential relationship is from data in a first project to data in a second project). In this manner, the method 500 continues with receiving 508, from a first designer of a first project of the multiple independent projects, a request to reference data in the set of data in a second project of the multiple independent projects.

In one or more embodiments, the object of the set of data may be a business object and the dependency relationship is a business or logical dependency, composition, or provenance that ties two business objects together.

At step 510, a determination is made regarding whether the potential relationship is valid (i.e., based on the master project dependency graph). In other words, a determination is made regarding whether the request to reference data is consistent with the graphically descriptive design representation (of the master project). Such a request to reference data may be a request to mount a software project (and steps 510-514 control the mounting). The determination in step 510 may also include analyzing, in the master project, the graphically descriptive design representation (including the dependency relationship between the objects represented by the nodes).

If the relationship is valid in step 510, the result of the comparison is Yes, and the system allows or permits creation of the potential relationship thus creating a fully integrated set of projects in step 512. If the potential relationship is invalid in step 510, the result of the comparison is No, and the system rejects prevents creation (per the master project dependency graph) in step 514. Thus, the request to reference data is allowed if a dependency relationship exists between the first project and the second project (in the master project), and is rejected if the dependency relationship does not exist in the master project.

In addition to the above, steps 502-514 may also include making a change to the graphically descriptive design representation (e.g., creating a new dependency relationship within step 502). Upon making such a change, a new version of the graphically descriptive design representation may be iterated and the new version may be recorded based on the new dependency relationship (e.g., within step 502). Subsequent versions (of the graphically descriptive design representation) may be further iterated (within step 502). Subsequent to the recording, the new version may be accessed to determine what the graphically descriptive design representation looked like at a time the new dependency relationship was created (within step 502). In one or more embodiments, within step 502, an additional independent project may be added to the graphically descriptive design representation, and in response (within step 502), an impact analysis of the addition may be conducted. Such an impact analysis analyzes an impact on the multiple independent projects. The impact analysis use case applies more to deletions and modifications of existing data. For example, if one project defines the capacity of a battery and there is a proposal to lower that capacity, impact analysis may need to be performed to verify that the new capacity is sufficient. Similarly, if an interface is defined on a module and that interface is being used at multiple places in other projects, the removal of this interface will have an impact on those projects. Only a thorough impact analysis will detect the presence and severity of the impact of the removal of that interface. In addition to the above, if a request to add a new dependency relationship would lead to a determination (at step 510) that a dependency loop would be created (as a result of the addition), the addition of the new dependency relationship would be prevented/rejected (steps 512/514).

Further to the above, dependency inheritance may be utilized. To utilize dependency inheritance (e.g., within step 502), a determination is made that the graphically descriptive design representation includes redundancy and the representation is redrawn by chaining the dependency relationships to remove the dependency.

Permissions for both the master project, graphically descriptive design representation, and projects/data within the individual projects may be controlled/defined (within step 502). For example, control of the graphically descriptive design representation (within step 502) may be limited to the master project architect/author. In another example (performed as part of step 502), suppose (a) a first user has access permission to a first project and a second project; (b) a second user has access permissions to the first project but does not have access permissions to the second project; and (c) a request to reference data (within step 508) is a chaining request from the first user to chain a project mount from the first project to the second project. In such an example, a determination (at step 510) is made that the chaining request would expose the second project to the second user via the chain, and as a result (and based on the determination), the request to reference data would be rejected (e.g., at step 514).

Analysis of Object Management Via the Graphically Descriptive Design Representation In view of the above, various advantages are provided via embodiments of the invention. Such advantages may include:

(1) Providing the ability to manage a dependency graph as a configuration controlled artifact outside of the individual project configuration control zones;

(2) Enabling a person with authority (could be an architect, lead engineer, manager, administrator, etc. henceforth referred to as master project architect) to architect the project structure and have full control over it;

(3) Allowing the relationships to be managed outside of the projects owning the linked nodes; and (4) Allowing the relationships to be visible from any end/perspective (e.g., from both the "impacting" perspective and "impacted" perspective).

In view of the above, while embodiments of the invention may utilize dependency management principles that exist in the software engineering domain (e.g., in the APACHE MAVEN software project management and comprehension tool, the GRADLE build automation system, etc.), the application of such principles to models generated by ADL languages are unique.

Further, prior art solutions fail to solve many problems. For example, some prior art solutions may segregate models that "use" other models, but require connections/relationships between them, into branch projects. Such a prior art solution may work until a modeler expands the used models and subsequently loads all the segregated models into one session, but such loading often causes the application to crash or significantly degrade performance. In this regard, in the prior art, the project relationships are controlled by the SysML specification, and the implementing applications load all of the branch projects into local memory (with limited processing and memory capabilities).

In another prior art solution models may be integrated within a separate model that "uses" two segregated independent models, creates the relationships between them, and stores those relationships. However, the "used" models will eventually create a circle of model usage. Unfortunately, the application and SysML specification and application cannot handle this type of integration.

In yet another prior art solution, models that do not interact may be segregated, and models may be constrained to a scalable level of complexity. However, with such segregation/constraints, the advantages of switching to a model based design process (from historical documentation) is negated because systems will be limited to their respective simple models.

In an additional prior art solution, instead of creating branches within a project, OSLC links are created between elements in separate SysML models. OSLC links can be managed in a separate database. However, with such a prior art solution, there is no master view or control of the overall set of data relationships between projects. Instead, each link will have to be explored to understand its intent or content, and the ability to query all of the models within an implied hierarchy is lost.

Hardware Environment

Figure 6:
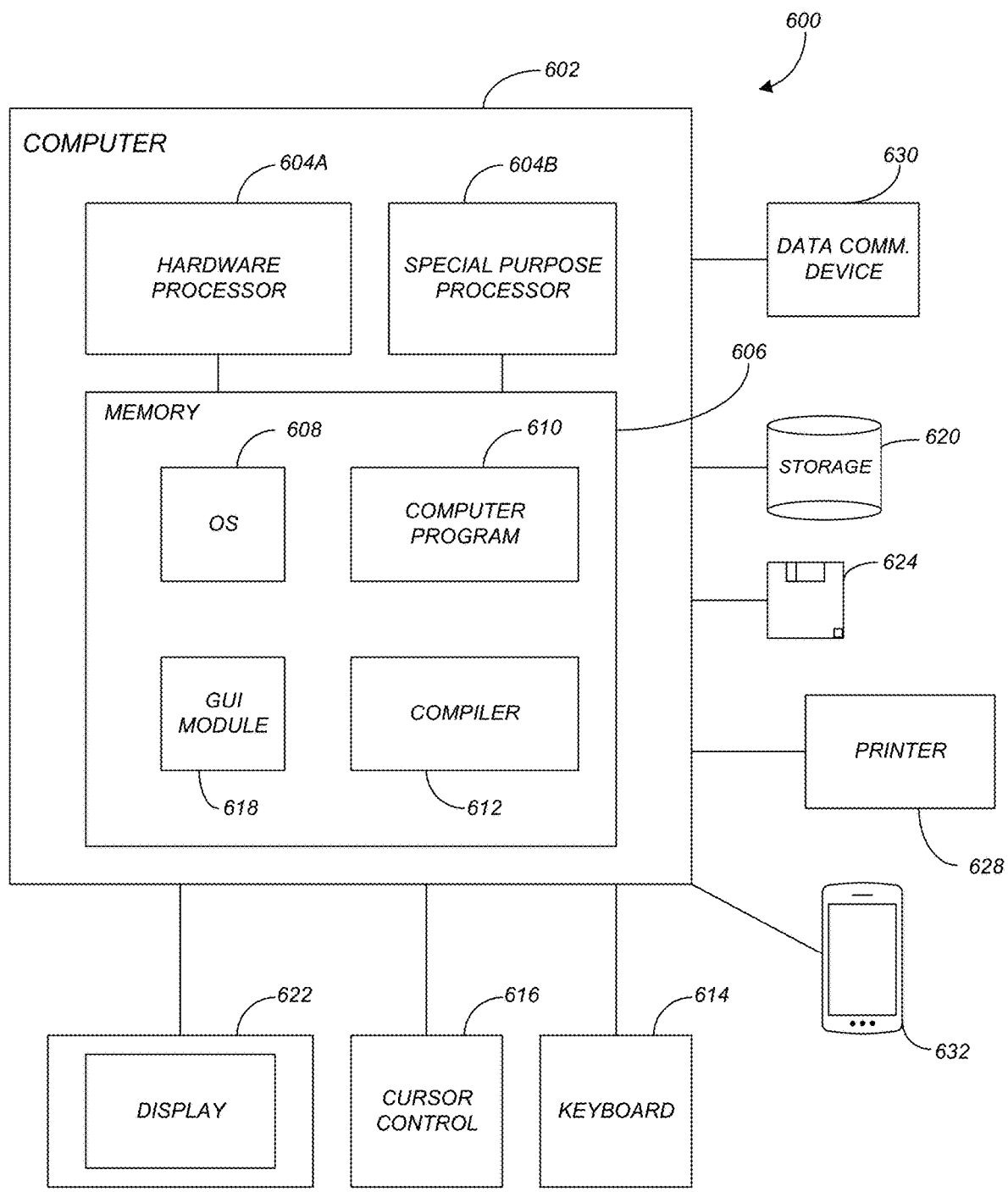
FIG. 6 is an exemplary hardware and software environment used to implement one or more embodiments of the invention.

FIG. 6 is an exemplary hardware and software environment 600 (referred to as a computer-implemented system and/or computer-implemented method) used to implement one or more embodiments of the invention. The hardware and software environment includes a computer 602 and may include peripherals. Computer 602 may be a user/client computer, server computer, or may be a database computer. The computer 602 comprises a hardware processor 604A and/or a special purpose hardware processor 604B (hereinafter alternatively collectively referred to as processor 604) and a memory 606, such as random access memory (RAM). The computer 602 may be coupled to, and/or integrated with, other devices, including input/output (I/O) devices such as a keyboard 614, a cursor control device 616 (e.g., a mouse, a pointing device, pen and tablet, touch screen, multi-touch device, etc.) and a printer 628. In one or more embodiments, computer 602 may be coupled to, or may comprise, a portable or media viewing/listening device 632 (e.g., an MP3 player, IPOD, NOOK, portable digital video player, cellular device, personal digital assistant, etc.). In yet another embodiment, the computer 602 may comprise a multi-touch device, mobile phone, gaming system, internet enabled television, television set top box, or other internet enabled device executing on various platforms and operating systems.

In one embodiment, the computer 602 operates by the hardware processor 604A performing instructions defined by the computer program 610 (e.g., a computer-aided design [CAD] application) under control of an operating system (OS) 608. The computer program 610 and/or the operating system 608 may be stored in the memory 606 and may interface with the user and/or other devices to accept input and commands and, based on such input and commands and the instructions defined by the computer program 610 and operating system 608, to provide output and results.

Output/results may be presented on the display 622 or provided to another device for presentation or further processing or action. In one embodiment, the display 622 comprises a liquid crystal display (LCD) having a plurality of separately addressable liquid crystals. Alternatively, the display 622 may comprise a light emitting diode (LED) display having clusters of red, green and blue diodes driven together to form full-color pixels. Each liquid crystal or pixel of the display 622 changes to an opaque or translucent state to form a part of the image on the display in response to the data or information generated by the processor 604 from the application of the instructions of the computer program 610 and/or operating system 608 to the input and commands. The image may be provided through a graphical user interface (GUI) module 618. Although the GUI module 618 is depicted as a separate module, the instructions performing the GUI functions can be resident or distributed in the operating system 608, the computer program 610, or implemented with special purpose memory and processors.

In one or more embodiments, the display 622 is integrated with/into the computer 602 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 602 according to the computer program 610 instructions may be implemented in a special purpose processor 604B. In this embodiment, some or all of the computer program 610 instructions may be implemented via firmware instructions stored in a read only memory (ROM), a programmable read only memory (PROM) or flash memory within the special purpose processor 604B or in memory 606. The special purpose processor 604B may also be hardwired through circuit design to perform some or all of the operations to implement the present invention. Further, the special purpose processor 604B may be a hybrid processor, which includes dedicated circuitry for performing a subset of functions, and other circuits for performing more general functions such as responding to computer program 610 instructions. In one embodiment, the special purpose processor 604B is an application specific integrated circuit (ASIC).

The computer 602 may also implement a compiler 612 that allows an application or computer program 610 written in a programming language such as C, C++, Assembly, SQL, PYTHON, PROLOG, MATLAB, RUBY, RAILS, HASKELL, or other language to be translated into processor 604 readable code. Alternatively, the compiler 612 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 610 accesses and manipulates data accepted from I/O devices and stored in the memory 606 of the computer 602 using the relationships and logic that were generated using the compiler 612.

The computer 602 also optionally comprises an external communication device such as a modem, satellite link, Ethernet card, or other device for accepting input from, and providing output to, other computers 602.

In one embodiment, instructions implementing the operating system 608, the computer program 610, and the compiler 612 are tangibly embodied in a non-transitory computer-readable medium, e.g., data storage device 620, which could include one or more fixed or removable data storage devices, such as a zip drive, floppy disc drive 624, hard drive, CD-ROM drive, tape drive, etc. Further, the operating system 608 and the computer program 610 are comprised of computer program 610 instructions which, when accessed, read and executed by the computer 602, cause the computer 602 to perform the steps necessary to implement and/or use the present invention or to load the program of instructions into a memory 606, thus creating a special purpose data structure causing the computer 602 to operate as a specially programmed computer executing the method steps described herein. Computer program 610 and/or operating instructions may also be tangibly embodied in memory 606 and/or data communications devices 630, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 602.

Figure 7:
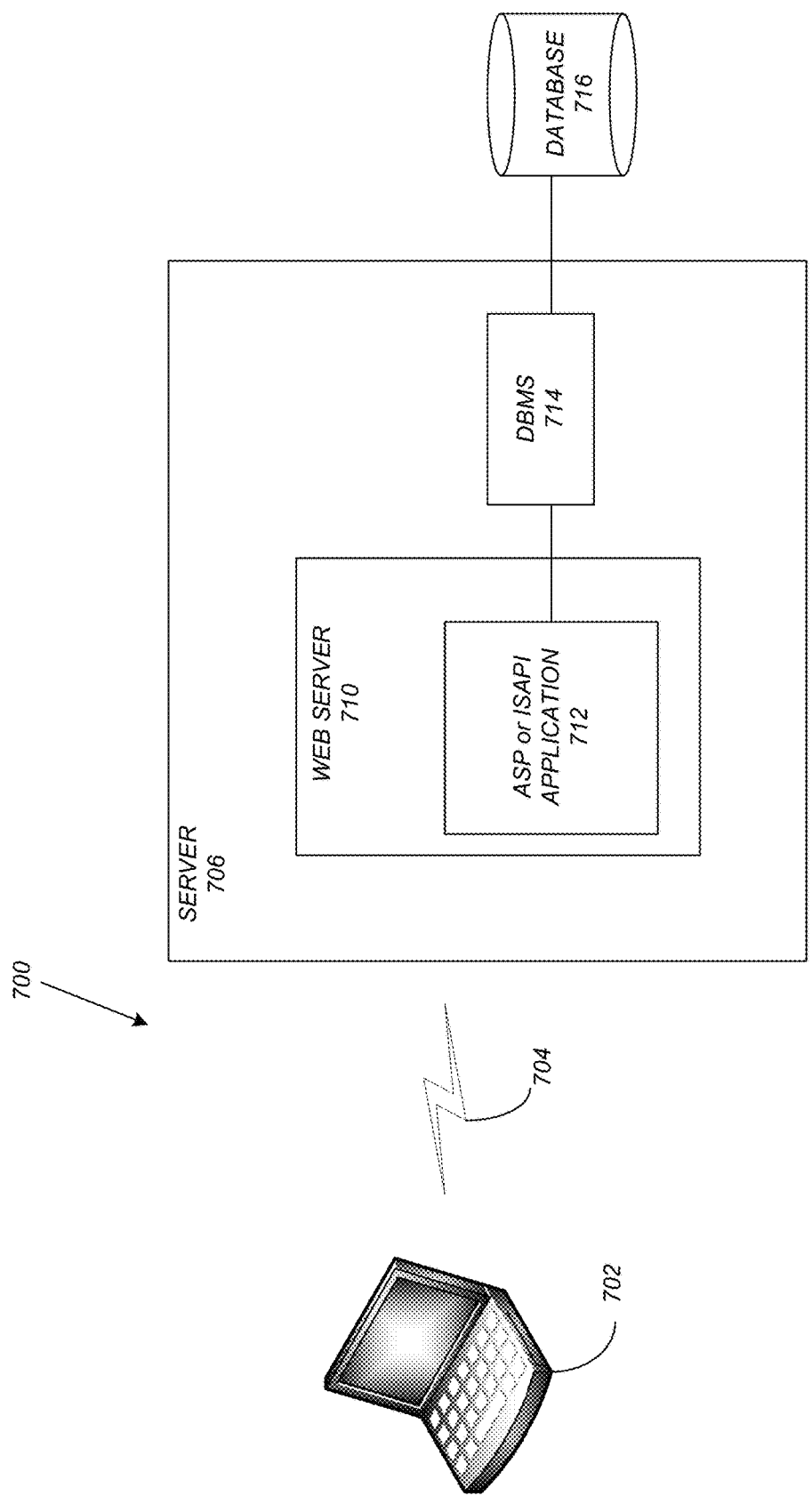
FIG. 7 schematically illustrates a typical distributed/cloud-based computer system using a network to connect client computers to server computers in accordance with one or more embodiments of the invention.

FIG. 7 schematically illustrates a typical distributed/cloud-based computer system 700 using a network 704 to connect client computers 702 to server computers 706. A typical combination of resources may include a network 704 comprising the Internet, LANs (local area networks), WANs (wide area networks), SNA (systems network architecture) networks, or the like, clients 702 that are personal computers or workstations (as set forth in FIG. 6), and servers 706 that are personal computers, workstations, minicomputers, or mainframes (as set forth in FIG. 6). However, it may be noted that different networks such as a cellular network (e.g., GSM [global system for mobile communications] or otherwise), a satellite based network, or any other type of network may be used to connect clients 702 and servers 706 in accordance with embodiments of the invention.

A network 704 such as the Internet connects clients 702 to server computers 706. Network 704 may utilize ethernet, coaxial cable, wireless communications, radio frequency (RF), etc. to connect and provide the communication between clients 702 and servers 706. Further, in a cloud-based computing system, resources (e.g., storage, processors, applications, memory, infrastructure, etc.) in clients 702 and server computers 706 may be shared by clients 702, server computers 706, and users across one or more networks. Resources may be shared by multiple users and can be dynamically reallocated per demand. In this regard, cloud computing may be referred to as a model for enabling access to a shared pool of configurable computing resources.

Clients 702 may execute a client application or web browser and communicate with server computers 706 executing web servers 710. Such a web browser is typically a program such as MICROSOFT INTERNET EXPLORER/EDGE, MOZILLA FIREFOX, OPERA, APPLE SAFARI, GOOGLE CHROME, etc. Further, the software executing on clients 702 may be downloaded from server computer 706 to client computers 702 and installed as a plug-in or ACTIVEX control of a web browser. Accordingly, clients 702 may utilize ACTIVEX components/component object model (COM) or distributed COM (DCOM) components to provide a user interface on a display of client 702. The web server 710 is typically a program such as MICROSOFT'S INTERNET INFORMATION SERVER.

Web server 710 may host an Active Server Page (ASP) or Internet Server Application Programming Interface (ISAPI) application 712, which may be executing scripts. The scripts invoke objects that execute business logic (referred to as business objects). The business objects then manipulate data in database 716 through a database management system (DBMS) 714. Alternatively, database 716 may be part of, or connected directly to, client 702 instead of communicating/obtaining the information from database 716 across network 704. When a developer encapsulates the business functionality into objects, the system may be referred to as a component object model (COM) system. Accordingly, the scripts executing on web server 710 (and/or application 712) invoke COM objects that implement the business logic. Further, server 706 may utilize MICROSOFT'S TRANSACTION SERVER (MTS) to access required data stored in database 716 via an interface such as ADO (Active Data Objects), OLE DB (Object Linking and Embedding DataBase), or ODBC (Open DataBase Connectivity).

Generally, these components 700-716 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 702 and 706 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 702 and 706. Embodiments of the invention are implemented as a software/CAD application on a client 702 or server computer 706. Further, as described above, the client 702 or server computer 706 may comprise a thin client device or a portable device that has a multi-touch-based display.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In view of the above, embodiments of the invention provide an overarching set of data links that manages the relationships between a SysML client and the permanent model repository it would normally write to. The overarching data links are managed in a separate parent database/repository/data-structure and extend the relationships established between sets of SysML data by digitally connecting the lower level database elements and storing their potential/defined relationships when they are created. These relationships are an implementation outside of the existing SysML specification. These relationships enable expansion, integration and assemblage within a larger body of data. The parent database has access to all data elements in the lower level database and establishes control or dictates what relationships can be made to which sets of data.

Further, the architecture description models of embodiments of the invention are large and complex and scale to a desired level of complexity. Models are loaded into local machine memory (RAM) and can exceed the scale of standard computing hardware. In addition, embodiments of the invention allow SysML models to be segregated independent of the application/specification restrictions and linked through the overarching database schema. The links/relationships can be defined by the user, or automatically and independently by the overarching parent model repository.

From a practical basis, embodiments of the invention enable segregation of SysML Models into separate distinct projects (not limited by branch divisions) to manage complexity and exceed the typical scalability constraints. Embodiments of the invention may allow independent control of the projects in a model repository and not require branches to establish unifying relationships. The SysML model and its internal elements will be aware of the links/relationships established with external projects and applications. Although described using SysML, embodiments of the invention combine a novel process capability (how to define links/relations); with a novel software capability (connect child models in one repository, overseen by database tools, with links that are managed in a parent repository with a separate set of data tools). The scope of the invention is not limited by link-types/protocols (REST [representational state transfer], SOAP [simple object access protocol], WSDL [web service definition language], JSON [JAVA script object notation], SOA [service oriented architecture], RDF [resource description framework], TCP [transmission control protocol], LLC [logical link control], hyper, etc.), or conventional database tools or structures (relational, object-based, persistent, key-value, lake, graph based, etc.). Each one of these combinations could represent a unique invention.

Embodiments of the invention may extend the query capabilities available to the users, and enable/establish a variety of link-types between models both inside and outside of the SysML specification and application. Further, embodiments of the invention may extend the number of internal objects and application models that can be linked, not restricted to an entire model (parent project), and can adapt to a variety of integrated product structures and views.

Embodiments of the invention may extend the options for managing configuration and access control of the models, and do not rely solely on the implementing SysML application to manage all of the configuration and access controls. Further, embodiments may extend the options for version control, model management (examples are related trade studies), classification (EAR [export administrative regulations], ITAR [international traffic in arms regulations], proprietary, limited), and administrative controls (extensible, backed-up, published). In addition, embodiments may work outside of the multi-user solutions currently available and implemented by existing applications.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for managing objects across multiple independent projects, comprising:
   (a) generating and displaying a graphically descriptive design representation of a master project for an engineering system architecture model, wherein:
      (i) the engineering system architecture model comprises the multiple independent projects;
      (ii) each of the multiple independent projects comprises and owns a set of data;
      (iii) the set of data is represented by the graphically descriptive design representation and comprises a hierarchy of two or more nodes arranged hierarchically;
      (iv) each of the two or more nodes represents an object of the set of data;
      (v) links between the two or more nodes define a dependency relationship between the objects represented by the linked nodes;
   (b) receiving, from a first designer of a first project of the multiple independent projects, a request to reference data in the set of data in a second project of the multiple independent projects;
   (c) determining if the request to reference data is consistent with the graphically descriptive design representation of the master project; and
   (d) allowing the request to reference data if a dependency relationship exists between the first project and the second project in the master project, and rejecting the request if the dependency relationship does not exist between the first project and the second project.

2. The computer-implemented method of claim 1, wherein the generating and displaying comprises:
   generating a root node of the two or more nodes, wherein the root node represents an overall system for the engineering system architecture model; and
   decomposing the engineering system architecture model into multiple subcomponents, wherein each remaining node of two or more nodes represents one of the multiple subcomponents.

3. The computer-implemented method of claim 1, wherein:
   request to reference data comprises a request to mount a software project; and
   the determining, the allowing, and the rejecting control the mounting.

4. The computer-implemented method of claim 1, wherein:
   the object of the set of data comprises a business object; and
   the dependency relationship comprises a business or logical dependency, composition, or provenance that ties two business objects together.

5. The computer-implemented method of claim 1, wherein the determining if the request to reference data is consistent with the graphically descriptive design representation of the master project comprises:
   analyzing, in the master project, the graphically descriptive design representation including the dependency relationship between the objects represented by the nodes.

6. The computer-implemented method of claim 1, further comprising:
    making a change to the graphically descriptive design representation, wherein the change comprises creating a new dependency relationship;
    iterating a new version of the graphically descriptive design representation;
    recording the new version based on the new dependency relationship;
    further iterating subsequent versions of the graphically descriptive design representation; and
    subsequent to the recording, accessing the new version to determine what the graphically descriptive design representation looked like at a time the new dependency relationship was created.

7. The computer-implemented method of claim 1, further comprising utilizing dependency inheritance by:
    determining that the graphically descriptive design representation includes redundancy; and
    redrawing the graphically descriptive design representation by chaining the dependency relationships to remove the redundancy.

8. The computer-implemented method of claim 1, further comprising:
    limiting control of the graphically descriptive design representation to an author of the graphically descriptive design representation.

9. The computer-implemented method of claim 1, further comprising:
    managing the graphically descriptive design representation, wherein the managing is conducted outside of the multiple independent projects that own the two or more nodes.

10. The computer-implemented method of claim 1, further comprising:
    adding an additional independent project to the graphically descriptive design representation; and
    conducting, based on the graphically descriptive design representation, an impact analysis of the adding, wherein the impact analysis analyzes an impact on the multiple independent projects.

11. The computer-implemented method of claim 1, wherein:
    a first user has access permissions to the first project and the second project;
    a second user has access permissions to the first project and does not have access permissions to the second project;
    the request to reference data comprises a chaining request from the first user to chain a project mount from the first project to the second project; and
    the computer-implemented method further comprising:
        determining that the chaining request would expose the second project to the second user via the chain; and
        rejecting the request to reference data based on the determining that the chaining request would expose the second project to the second user via the chain.

12. The computer-implemented method of claim 1, further comprising:
    receiving a request to add a new dependency relationship to the graphically descriptive design representation;
    determining that the new dependency relationship would create a dependency loop; and
    preventing the adding of the new dependency relationship.

13. A computer-implemented system for managing objects across multiple independent projects, comprising:
    (a) a computer having a memory;
    (b) a processor executing on the computer;
    (c) the memory storing a computer program that is executed by the processor, wherein the computer program:
        (i) generate and display a graphically descriptive design representation of a master project for an engineering system architecture model, wherein:
            (A) the engineering system architecture model comprises the multiple independent projects;
            (B) each of the multiple independent projects comprises and owns a set of data;
            (C) the set of data is represented by the graphically descriptive design representation and comprises a hierarchy of two or more nodes arranged hierarchically;
            (D) each of the two or more nodes represents an object of the set of data;
            (E) links between the two or more nodes define a dependency relationship between the objects represented by the linked nodes;
        (ii) receive, from a first designer of a first project of the multiple independent projects, a request to reference data in the set of data in a second project of the multiple independent projects;
        (iii) determine if the request to reference data is consistent with the graphically descriptive design representation of the master project; and
        (iv) allow the request to reference data if a dependency relationship exists between the first project and the second project in the master project, and reject the request if the dependency relationship does not exist between the first project and the second project.

14. The computer-implemented system of claim 13, wherein the computer program generates and displays by:
    generating a root node of the two or more nodes, wherein the root node represents an overall system for the engineering system architecture model; and
    decomposing the engineering system architecture model into multiple subcomponents, wherein each remaining node of two or more nodes represents one of the multiple subcomponents.

15. The computer-implemented system of claim 13, wherein:
    the request to reference data comprises a request to mount a software project; and
    control of the mounting is maintained by the computer program determining, allowing, and rejecting.

16. The computer-implemented system of claim 13, wherein:
    the object of the set of data comprises a business object; and
    the dependency relationship comprises a business or logical dependency, composition, or provenance that ties two business objects together.

17. The computer-implemented system of claim 13, wherein the computer program determines if the request to reference data is consistent with the graphically descriptive design representation of the master project by:
    analyzing, in the master project, the graphically descriptive design representation including the dependency relationship between the objects represented by the nodes.

18. The computer-implemented system of claim 13, wherein the computer program further:

makes a change to the graphically descriptive design representation, wherein the change comprises creating a new dependency relationship;

iterates a new version of the graphically descriptive design representation;

records the new version based on the new dependency relationship;

further iterates subsequent versions of the graphically descriptive design representation; and subsequent to the recording, accesses the new version to determine what the graphically descriptive design representation looked like at a time the new dependency relationship was created.

19. The computer-implemented system of claim 13, wherein the computer program further utilizes dependency inheritance by:

determining that the graphically descriptive design representation includes redundancy; and redrawing the graphically descriptive design representation by chaining the dependency relationships to remove the redundancy.

20. The computer-implemented system of claim 13, further comprising:

the computer program limiting control of the graphically descriptive design representation to an author of the graphically descriptive design representation.

21. The computer-implemented system of claim 13, wherein the computer program further:

manages the graphically descriptive design representation, wherein the managing is conducted outside of the multiple independent projects that own the two or more nodes.

22. The computer-implemented system of claim 13, wherein the computer program further:

adds an additional independent project to the graphically descriptive design representation; and conducts, based on the graphically descriptive design representation, an impact analysis of the adding, wherein the impact analysis analyzes an impact on the multiple independent projects.

23. The computer-implemented system of claim 13, wherein:

a first user has access permissions to the first project and the second project;

a second user has access permissions to the first project and does not have access permissions to the second project;

the request to reference data comprises a chaining request from the first user to chain a project mount from the first project to the second project; and the computer program further:

determines that the chaining request would expose the second project to the second user via the chain; and rejects the request to reference data based on the determining that the chaining request would expose the second project to the second user via the chain.

24. The computer-implemented system of claim 13, wherein the computer program further:

receives a request to add a new dependency relationship to the graphically descriptive design representation;

determines that the new dependency relationship would create a dependency loop; and prevents the adding of the new dependency relationship.

* * * * *